US011255016B2

(12) United States Patent
Braghiroli et al.

(10) Patent No.: US 11,255,016 B2
(45) Date of Patent: Feb. 22, 2022

(54) MICROWAVE MAGNETRON WITH CONSTANT ANODIC IMPEDANCE AND SYSTEMS USING THE SAME

(71) Applicant: MKS Instruments, Inc., Andover, MA (US)

(72) Inventors: Francesco Braghiroli, Reggio Emilia (IT); Paolo Balocchi, Reggio Emilia (IT)

(73) Assignee: MKS INSTRUMENTS, INC., Andover, MA (US)

( * ) Notice: Subject to any disclaimer, the term of this patent is extended or adjusted under 35 U.S.C. 154(b) by 341 days.

(21) Appl. No.: 16/593,942

(22) Filed: Oct. 4, 2019

(65) Prior Publication Data

US 2021/0102293 A1    Apr. 8, 2021

(51) Int. Cl.
*H01J 25/50*    (2006.01)
*H01J 23/38*    (2006.01)
(Continued)

(52) U.S. Cl.
CPC .......... *C23C 16/511* (2013.01); *C23C 16/274* (2013.01); *H01J 23/38* (2013.01);
(Continued)

(58) Field of Classification Search
CPC ............... H01J 37/3408; H01J 37/3405; H01J 2225/587; H01J 2225/50; H01J 25/00;
(Continued)

(56) References Cited

U.S. PATENT DOCUMENTS

| 7,485,827 | B2 | 2/2009 | Garuti et al. |
| 2004/0104679 | A1 | 6/2004 | Obata et al. |
| 2014/0042022 | A1* | 2/2014 | Xu ........................ C23C 14/566 |
| | | | 204/298.15 |

FOREIGN PATENT DOCUMENTS

| BR | 102014026946 A2 * | 9/2015 | ........ H01J 37/32055 |
| JP | 2005222908 A | 8/2005 | |

(Continued)

OTHER PUBLICATIONS

International Search Report and Written Opinion for corresponding International Application No. PCT/US20/42451, dated Nov. 6, 2020.

*Primary Examiner* — Henry Luong
(74) *Attorney, Agent, or Firm* — Burns & Levinson LLP; Steven M. Mills

(57) ABSTRACT

A microwave magnetron includes a cathode for emitting electrons, a filament for receiving a filament current to heat the cathode to enable to cathode to emit the electrons, and an anode to which anodic power can be applied to affect a flow of the electrons. An anodic power input receives the anodic power to be applied to the anode, the anodic power being characterized by an anodic current, an anodic voltage, and an anodic impedance, the anodic impedance being a quotient of the anodic voltage and the anodic current. An electromagnet power input receives electromagnet power and applies the electromagnet power to an electromagnet to control an intensity of a magnetic field, the electromagnet power being characterized by an electromagnet current. A controller adjusts at least one of the parameters of the magnetron to affect the flow of electrons while maintaining the anodic impedance constant.

14 Claims, 15 Drawing Sheets

(51) Int. Cl.
*C23C 16/511* (2006.01)
*H01J 25/58* (2006.01)
*H01J 37/32* (2006.01)
*C23C 16/27* (2006.01)
*H05H 1/46* (2006.01)

(52) U.S. Cl.
CPC ........ *H01J 25/58* (2013.01); *H01J 37/32201* (2013.01); *H05H 1/46* (2013.01); *H01J 2237/3321* (2013.01)

(58) Field of Classification Search
CPC ........ H01J 23/075; H01J 25/60; H01J 25/587; H01J 37/3452; H01J 25/50; H01J 37/32192; H01J 37/3266; H01J 23/38; H01J 25/58; H01J 37/32201; H01J 2237/3321; C23C 14/35; C23C 14/351; C23C 16/511; C23C 16/274; Y02P 70/50; D06F 58/266; F26B 3/347; H03B 9/10; H01L 21/3065; H03C 1/30; C03C 2218/156; H05H 1/46

See application file for complete search history.

(56) References Cited

FOREIGN PATENT DOCUMENTS

JP        2007335351 A    12/2007
KR     1020040026812 A    4/2004

* cited by examiner

MICROWAVE MAGNETRON WITH CONSTANT ANODIC IMPEDANCE AND SYSTEMS USING THE SAME

BACKGROUND

1. Technical Field

The present disclosure is related to microwave magnetrons and systems using the microwave magnetrons and, in particular, to microwave magnetrons and systems using the microwave magnetrons in which anodic impedance is controlled to provide improved magnetron performance and reliability.

2. Discussion of Related Art

Magnetrons are devices which generate microwave energy by converting power provided to an anode into microwave radiation. They are essentially vacuum diodes that are made up of circular resonant cavities around a cathode immersed in a perpendicular magnetic field. This magnetic field results in a force that changes the motion of electrons from a straight path to a curved path. The magnetron generates microwaves using the interaction of this stream of electrons with a magnetic field while moving past a series of open metal cavities, i.e., cavity resonators. The electrons pass by the openings of these cavities and cause radio waves to oscillate within. The frequency of the microwaves produced, i.e., the resonant frequency, is determined by the physical dimensions of the cavities. The magnetron generates a high-power microwave output signal from the direct current electricity supplied to the vacuum tube.

Magnetrons are used in many applications in which microwave radiation is employed. For example, the most common commercial application of the continuous wave (CW) magnetron is the microwave oven. An industrial application for magnetrons is in the field of plasma generation. In plasm generators, a magnetron can be used to provide microwave excitation energy to a plasma cavity to ignite and sustain generation of plasma. Plasma generators using magnetrons have many applications, including, for example, in semiconductor device fabrication processes, such as chemical vapor deposition (CVD). CVD can also be used in other processes such as synthetic diamond growth.

Many of the processes using plasma can be very complex and time consuming. For example, a CVD synthetic diamond growth process can extend continuously over multiple days, in which a synthetic diamond is grown slowly, layer by layer, without interruption in the process. Over this lengthy process, a complex recipe of plasma generation steps is typically executed. These multiple steps may call for adjustments in the plasma generation, which can in turn call for adjustments in the microwave plasma signal being generated by the magnetron. For example, it is well known that ignition of plasma requires a higher power level in the microwave signal than is required in sustaining the plasma at a constant level after ignition. Accordingly, adjustments in one or more parameters in the magnetron are required between plasma ignition and sustained plasma generation. Similarly, the amount of plasma required during the process may also require adjustment, which also drives the requirement to make adjustments to the magnetron during the process.

If the magnetron should operate with instability, such as by shutting down or experiencing changes in microwave output features unexpectedly, an interruption or change in plasma generation could occur, which may then interrupt the overall process, e.g., CVD synthetic diamond growth. This could result in a very costly loss of time and product fabrication, as the interrupted batch of product would likely have to be discarded, and the process would have to be started again from the beginning. Therefore, it is very important that the magnetron be operated at a very high level of stability and reliability, even through multiple parameter adjustments during the process.

SUMMARY

According a one aspect, a microwave magnetron is provided. The microwave magnetron includes a cathode for emitting electrons, a filament for receiving a filament current to heat the cathode to enable to cathode to emit the electrons, and an anode to which anodic power can be applied to affect a flow of the electrons. An anodic power input receives the anodic power to be applied to the anode, the anodic power being characterized by an anodic current, an anodic voltage, and an anodic impedance, the anodic impedance being a quotient of the anodic voltage and the anodic current. An electromagnet provides a magnetic field in which the electrons flow. An electromagnet power input receives electromagnet power and applies the electromagnet power to the electromagnet to control an intensity of the magnetic field, the electromagnet power being characterized by an electromagnet current. A controller controls parameters of the microwave magnetron, the controller adjusting at least one of the parameters of the magnetron to affect the flow of electrons while maintaining the anodic impedance constant.

In some exemplary embodiments, the parameters of the microwave magnetron controlled by the controller comprise the anodic current, the filament current, and the electromagnet current. In some exemplary embodiments, the controller monitors the parameters of the microwave magnetron. In some exemplary embodiments, the controller is adapted to issue an alarm based on at least one of the monitored parameters of the microwave magnetron.

In some exemplary embodiments, the controller monitors the anodic voltage. In some exemplary embodiments, the controller is adapted to issue an alarm based on the monitored anodic voltage.

In some exemplary embodiments, the microwave magnetron further comprises a filament control module between the controller and the filament, the filament control module generating a filament current monitoring signal and forwarding the filament current monitoring signal to the controller, and the filament control module receiving a filament current setting signal from the controller. In some exemplary embodiments, the microwave magnetron further comprises a filament transformer between the filament control module and the filament.

In some exemplary embodiments, the microwave magnetron further comprises an electromagnet control module between the controller and the electromagnet, the electromagnet control module generating an electromagnet current monitoring signal and forwarding the electromagnet current monitoring signal to the controller, and the electromagnet control module receiving an electromagnet current setting signal from the controller.

In some exemplary embodiments, the microwave magnetron further comprises a microwave output for providing output microwave energy out of the microwave magnetron. In some exemplary embodiments, the microwave output is connectable to a system for processing a substrate. In some exemplary embodiments, the system is a plasma generation system. In some exemplary embodiments, the system is a chemical vapor deposition (CVD) system. In some exemplary embodiments, the system is a synthetic diamond growth chemical vapor deposition (CVD) system.

BRIEF DESCRIPTION OF THE DRAWINGS

The present disclosure is further described in the detailed description which follows, in reference to the noted plurality of drawings by way of non-limiting examples of embodiments of the present disclosure, in which like reference numerals represent similar parts throughout the several views of the drawings.

DETAILED DESCRIPTION

Figure 1A:
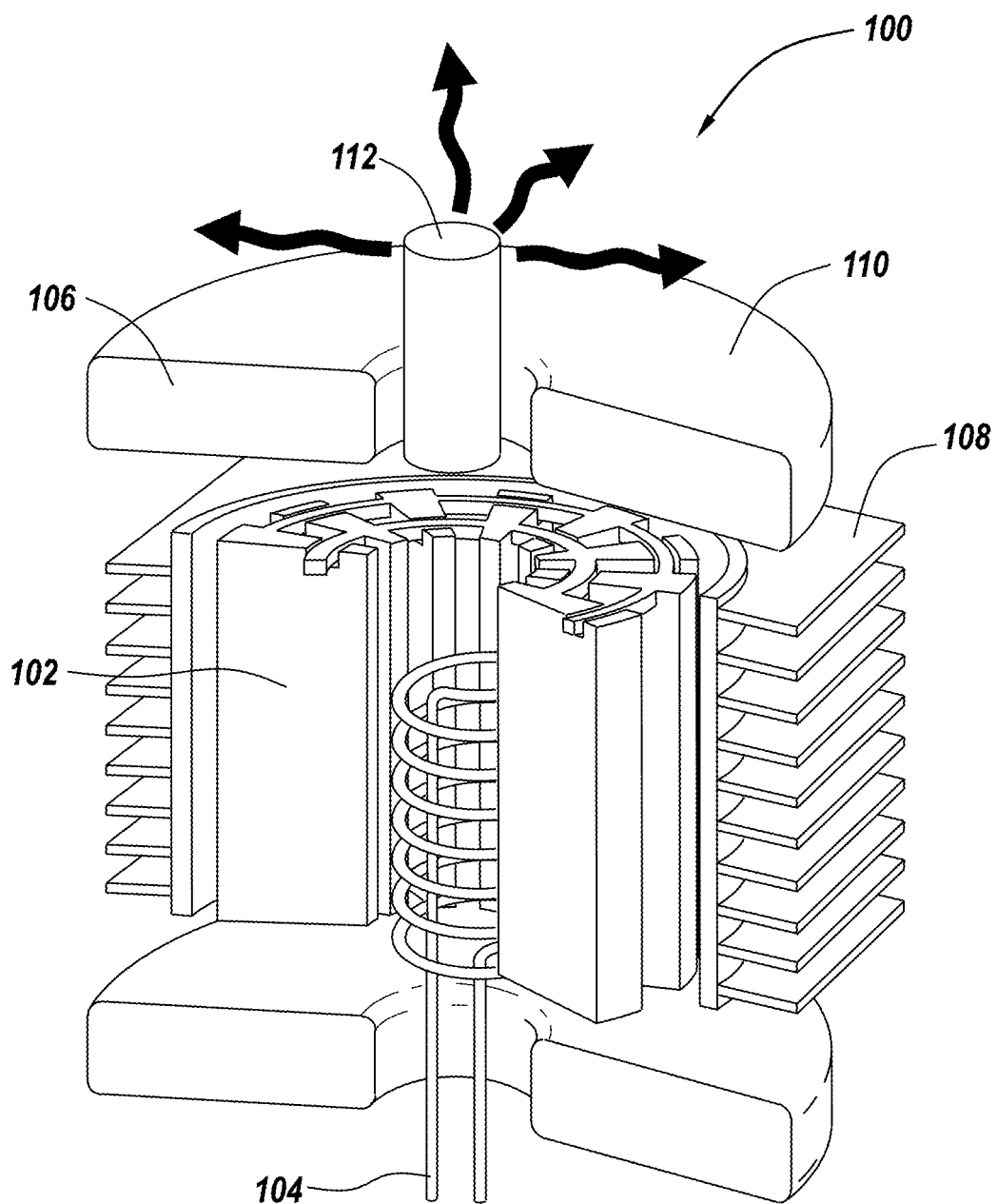
FIGS. 1A and 1B include schematic diagrams of two magnetrons, used in accordance with some exemplary embodiments.
Figure 1B:
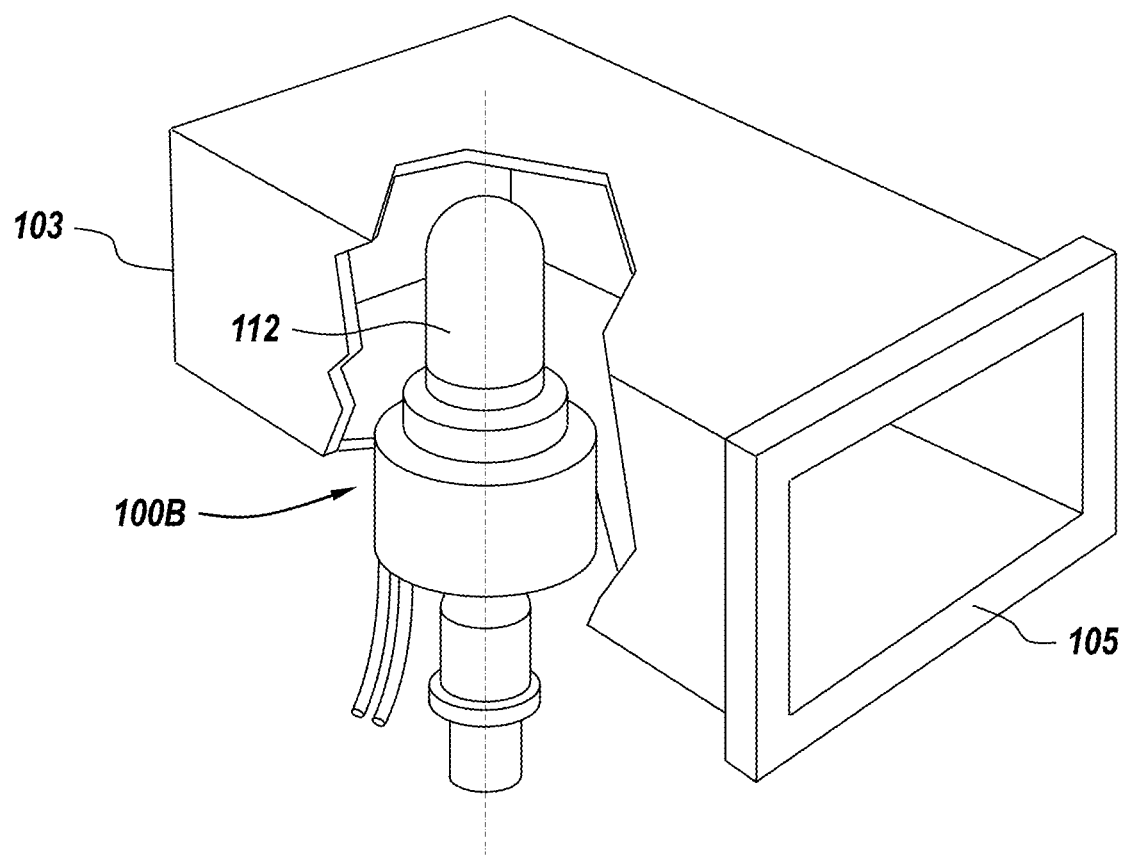

For description of well-known construction and function of conventional magnetrons, see *Handbook of Microwave Technology*, Chapter 2, "Magnetrons," by Wayne Love, edited by T. Koryu Ishii, published by Academic Press, Inc., 1995. FIGS. 1A and 1B include schematic diagrams of two exemplary magnetrons 100, identified in FIGS. 1A and 1B by reference numerals 100A, 100B, respectively, used in accordance with some exemplary embodiments. It should be noted the magnetrons of the present disclosure are referred to herein nonspecifically by reference numeral 100. Referring to FIGS. 1A and 1B, magnetrons 100A, 100B include an anode 102 surrounding a cathode 104 and a permanent magnet 106. Microwave radiation generated by magnetrons 100A, 100B is emitted at output antenna 112 into waveguide 103, which includes output flange 105 for coupling the microwave energy output from magnetrons 100A, 100B, to a system. Typically, magnetrons 100A, 100B include a plurality of cooling fins 108 for heat removal. Magnetrons 100A, 100B are crossed-field vacuum tubes, which means that the flow of electrons, the electric field and the magnetic field are mutually perpendicular.

Cathode 104 is the source of electrons and has a negative potential with respect to anode 102. Cathode 104 is made of a conductive metal, such as tungsten, and it is wound in the shape of a helix. Cathode 104 is heated to emit electrons by either (i) direct heating of cathode 104 by passing electric current through it, or (ii) electrons in an oscillating magnetron returning to cathode 104, thus causing heat.

Figure 2:
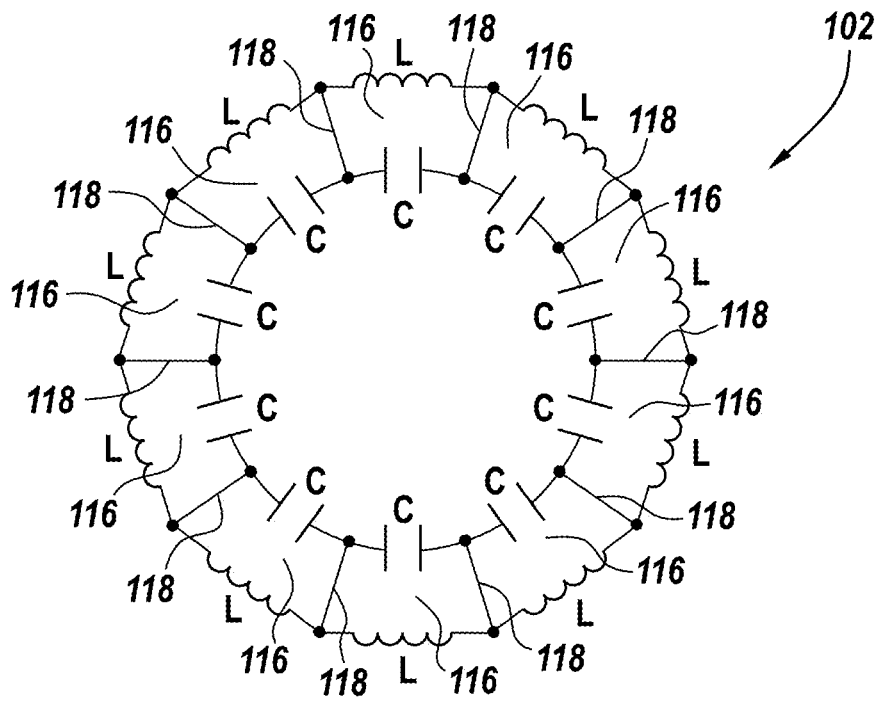
FIG. 2 includes a schematic LC circuit equivalent diagram of the anode illustrated in FIG. 1.

FIG. 2 includes a schematic LC circuit equivalent diagram of anode 102. Referring to FIG. 2, anode 102 is made of a conductive metal such as copper. It includes a set of resonant cavities 116 disposed around cathode 104, and is characterized as a parallel LC circuit, with each cavity 116 being characterized by an inductance L and capacitance C. Each cavity 116 is disposed between a pair of vanes 118. The LC circuit has a resonant frequency of oscillation when cavity 116 is operating in PI mode (What does "PI" stand for?), which is the most efficient mode of operation, although there are other undesirable oscillation modes. Output from magnetron 100 is accomplished by coupling microwave energy in cavities 116 to antenna 112.

In the absence of a magnetic field, magnetron 100 would act as a diode, wherein electrons emitted from cathode 104 would travel radially outward in a straight path to anode 102 under the force applied to the electrons by the electric field between cathode 104 and anode 102. In the presence of the magnetic field provided by permanent magnet 106, which is perpendicular to the electric field, there is a force on the electrons in addition to the electric field force, this magnetic field impeding the path of the electrons. With the magnetic field, the path of the electrons is circular. At an anode voltage above the Hull cutoff voltage, in the presence of the magnetic field and the electric field, the electrons reach anode 102, and current flows. Below this voltage, no current flows. The Hull cutoff voltage is dependent on the magnetic field, the electric potential, the radius of anode 102, and the radius of cathode 104.

In the presence of PI-mode electromagnetic field, alternating positive and negative voltages are present on vanes 118. If an electron leaves the cathode into an accelerating field, the electron will speed up and extract energy from the electromagnetic field. These higher energy electrons will be greatly affected by the magnetic field and will be returned to cathode 104, which causes heating of cathode 104. As anode 102 voltage is increased, cathode 104 filament voltage must be reduced to keep cathode temperature constant. Electrons that enter the electromagnetic field from a decelerating field give up some of their DC energy to the electromagnetic field. If the angular velocity of the electron is such that it is always in a decelerating field, then almost all of the energy is given up to the electromagnetic field and strikes anode 102.

Figure 3:
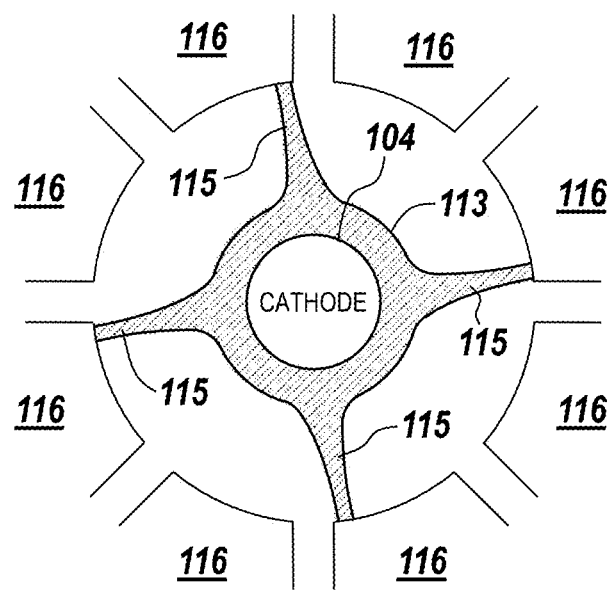
FIG. 3 is a schematic illustration of the electron cloud between the cathode and the anode illustrated in FIG. 1.

Because there are regions of electrons that are in a decelerating field and not in an accelerating field, and because these regions move with an angular frequency proportional to the resonant cavity frequency, there is a cloud 113 of electrons with spokes, as illustrated in FIG. 3, which is a schematic illustration of the electron "cloud" between cathode 104 and anode 102, illustrating the spokes 115. As spokes 115 move in a decelerating RF field, the electrons that are close to the negative potential vane are decelerated, while the electrons close to the positive potential vane are accelerated. This causes the electrons in the spoke to bunch even further. The bunching of the electrons in each spoke tends to keep spokes 115 equally spaced. Electrons that do reach anode 102 have nearly given up their energy.

The magnetic field causes the circular path of the electrons in the electron cloud. It must be as close to parallel in relation to the axis of the cathode as possible in the interaction region. It is also important that the field not change with time in order to keep the output power constant. The magnetic field can be formed from permanent magnets 106 or electromagnets.

Figure 4A:
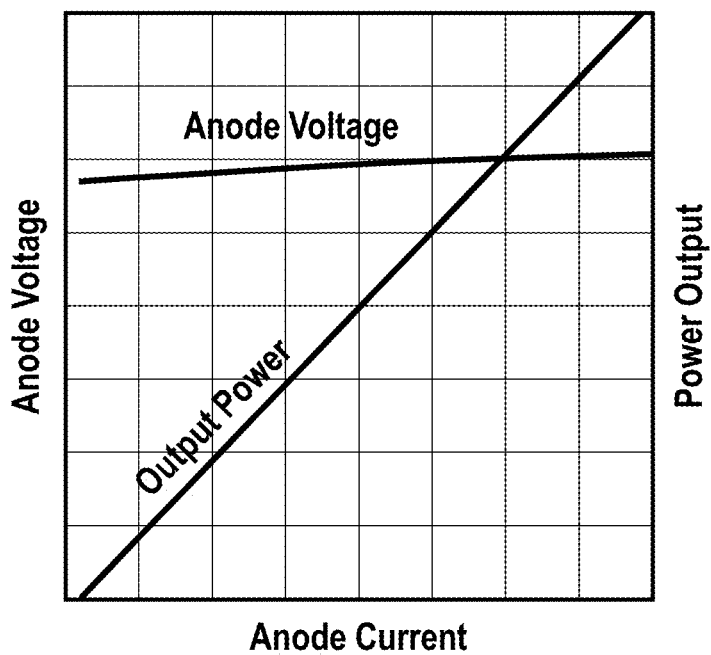
FIG. 4A is a curve illustrating output power and anode voltage versus the anode current for a typical conventional magnetron.
Figure 4B:
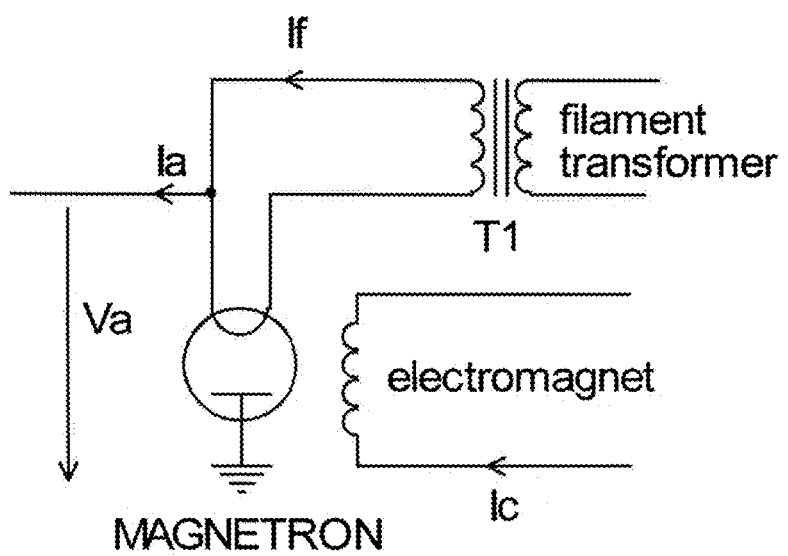
FIG. 4B includes a schematic diagram illustrating certain parameters associated with operation of the magnetron of FIG. 4A.
Figure 5:
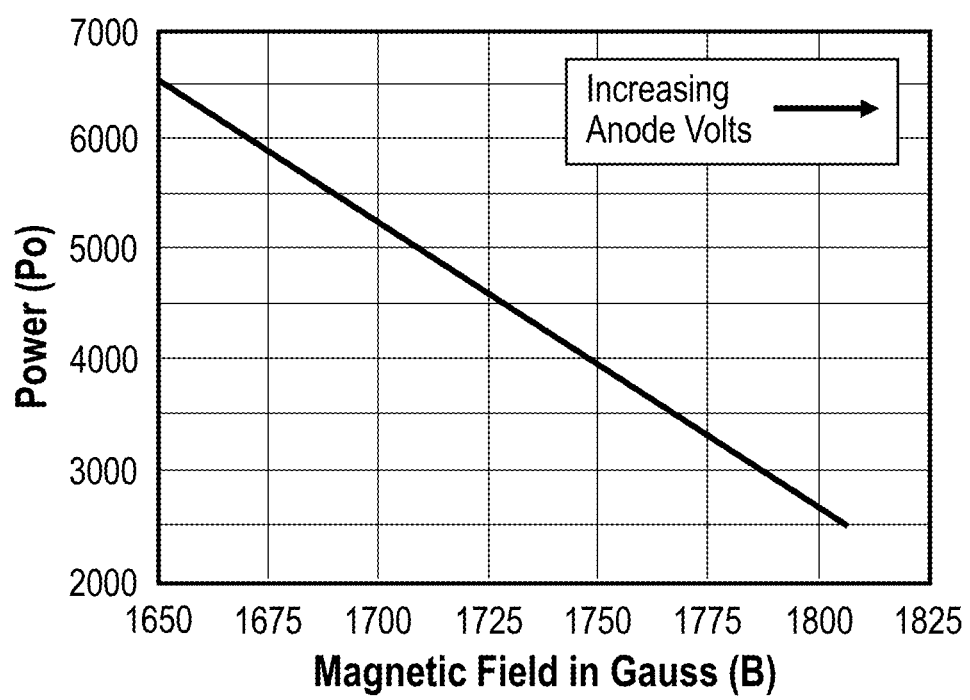
FIG. 5 is a curve illustrating output power versus magnetic field for a typical conventional magnetron.

Typically, there is need to adjust the output power of the magnetron during operation. Several methods are commonly used to change the power that is applied to the load. These methods include: (i) pulsing the output power of the magnetron, (ii) changing the anode current, (iii) changing the magnetic field, and (iv) adjusting the microwave energy supplied to the load. Referring to item (ii), a reduction in input power will result in a change in output power. The output power of a magnetron is directly proportional to the anode current. As the anode voltage increased initially, there is little anode current. At a voltage that is determined partially by the magnetic field, current will start to flow and the magnetron will start to oscillate. The voltage, referred to as the Hartree voltage, is dependent of the magnetic field, the anode radius, the cathode radius, and the wavelength. In the oscillating region, a large change in anode current will give a small change in anode voltage. Most power supplies are current stabilized to maintain output power. FIG. 4A is a curve illustrating output power and anode voltage versus the anode current for a typical conventional magnetron. FIG. 4B includes a schematic diagram illustrating certain parameters associated with operation of the magnetron of FIG. 4A. Referring to FIGS. 4A and 4, from the curve of FIG. 4A, it is noted that the filament voltage must be increased as the anode current Ia is reduced. It should be noted that filament current If is the current flowing in the filament which warms the filament to enable the filament to emit electrons. A typical value of filament current If in the context of the present disclosure is 115 Amperes at 12 Volts. In the magnetron 100 of the present disclosure, one of the filament taps of filament transformer T1 is connected also to the cathode negative high voltage. The anode current Ia is a DC current at an anode voltage Va, which has a typical value in the context of the present disclosure of 4-5 Amperes. It should be noted that the filament is the same as the cathode, but filament current If is not the same as cathode current. Regarding item (iv) above, FIG. 5 is a curve illustrating output power versus magnetic field for a typical conventional magnetron. It is noted from this particular example that a 10% change in magnetic field will change the output power by 60%. Changing the magnetic field requires a separate power supply to power an electromagnet, but it can be a low-power supply. This low-power supply is isolated from the high voltage supply and can easily be adjusted to give the desired output power.

As noted above, magnetron 100 is a vacuum tube which converts electric anodic power into microwave radiation. Microwave output power in magnetron 100 is proportional to the input electrical power, which is given by the product of anodic voltage Va and anodic current Ia. The hot filament emits electrons, which are subject to the electric field and the magnetic field. The electric E field is created by high anodic voltage between anode 102 and cathode 104. The magnetic B field is created by magnet 106, which can be a permanent magnet or electromagnet. Preferably, to allow for magnetic field adjustment, magnet 106 is an electromagnet. With an electromagnet, the intensity of the magnetic field B is controlled regulating coil current intensity. Tube or magnetron 100 emits microwave radiation as the applied E and B fields force electrons into a curve trajectory. Interaction occurs between the resonant cavity structure and the electron cloud by which the electrons transfer their energy into the oscillating electromagnetic field. In typical large-scale commercial applications, magnetron 100 generates radiation at nominal frequencies such as 2.45 GHz and 915 MHz. Typical magnetron 100 efficiency at 2.45 GHz is approximately 65% and at 915 MHz in approximately 85%. It will be understood that the present disclosure is applicable to magnetrons operating at any microwave frequency.

A power supply for suppling power to operate magnetron 100 supplies a high voltage to magnetron 100. It also supplies anodic current Ia and filament current If and voltage necessary to heat the filament to emission. The power supply also provides magnet current to generate the required magnetic field. The power supply can be of a switching configuration or a linear configuration. The switch-mode power supply can deliver 50,000 or more packet of energy per second, while the linear power supply, in contrast, is driven by the line frequency and delivers 100 to 120 packets (50 or 60 Hz) per second. The use of the switching power supply provides faster response time for events, such as turn-on, power increase/decrease, restart after fault, etc. It also results in less stored energy delivered to magnetron 100 during a fault event, e.g., arc.

Figure 6A:
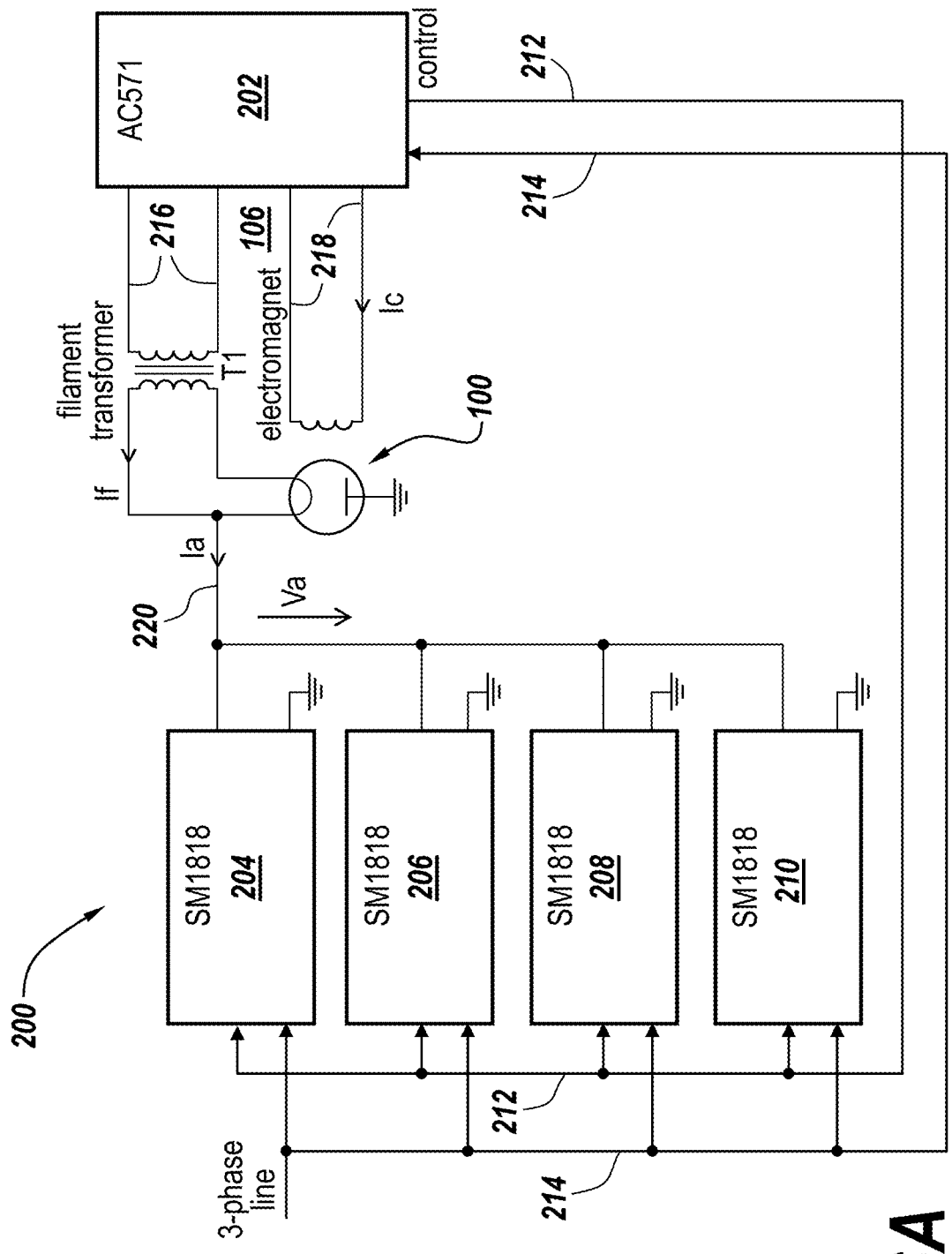
FIG. 6A includes a schematic block diagram of a system using a magnetron, according to some exemplary embodiments.
Figure 6B:
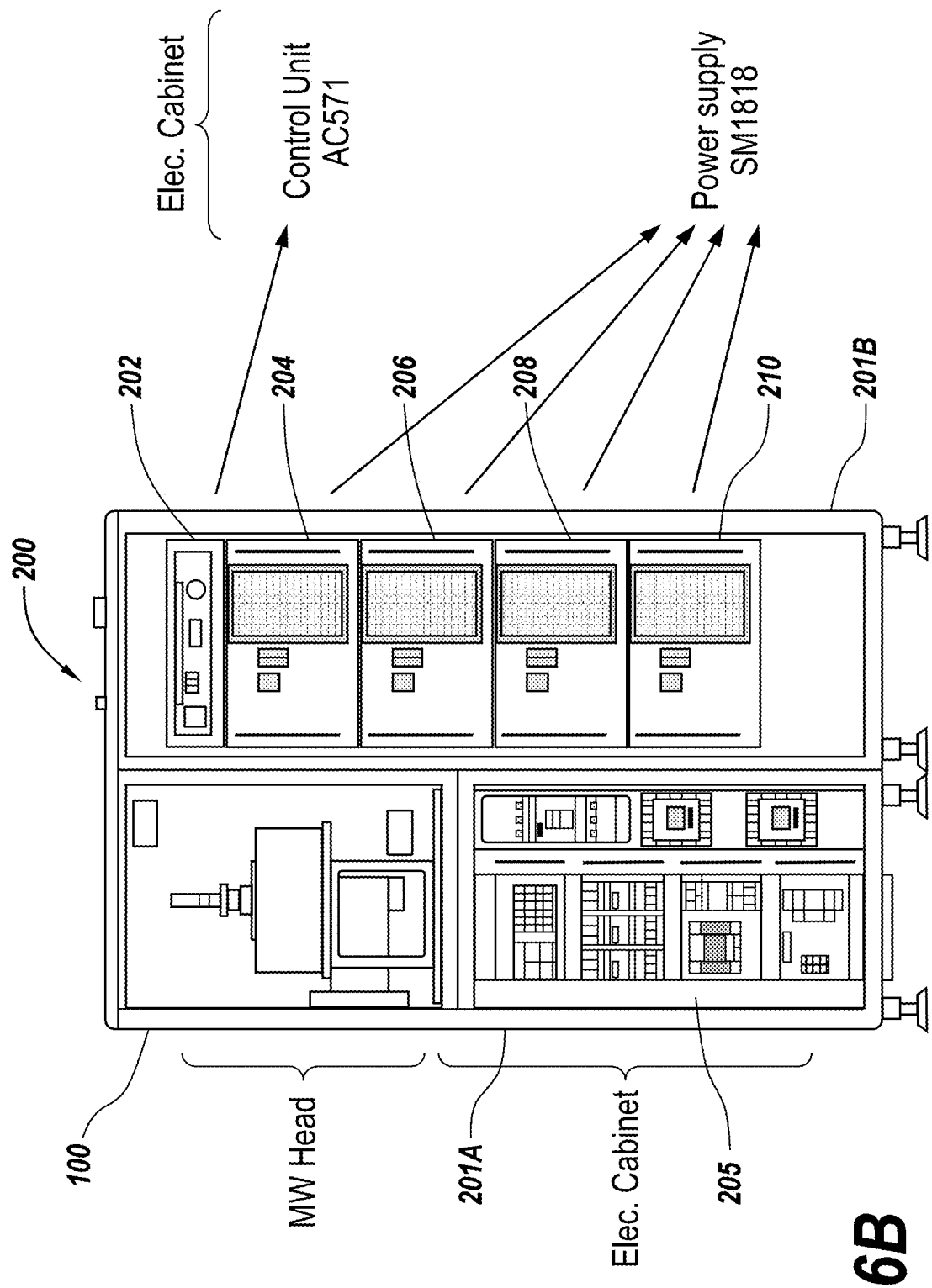
FIG. 6B includes a schematic front view of a physical configuration of the system of FIG. 6B mounted in one or more electrical cabinets, according to some exemplary embodiments.

FIG. 6A includes a schematic block diagram of a system 200 using magnetron 100, according to some exemplary embodiments. FIG. 6B includes a schematic front view of a physical configuration of system 200 mounted in one or more electrical cabinets 201A, 201B, according to some exemplary embodiments. Referring to FIGS. 6A and 6B, system 200 includes magnetron 100 connected to a power supply system 201. Power supply system 201 includes a control module 202 connected by a control bus 212 to a plurality, e.g., four, power modules 204, 206, 208, 210. In some exemplary embodiments, control module 202 can be an AC571 Controller, manufactured and sold by MKS Instruments of Andover, Mass., USA, or other similar control module. In some exemplary embodiments, each power module 204, 206, 208, 210 is a SM1818 Power Module, manufactured and sold by MKS Instruments of Andover, Mass., USA, or other similar power module.

Control module 202 provides control over the electromagnet 106 as well as the magnetron filament. Control module 202 also serves as the user interface by means of a display and various push buttons, knobs, etc., on its front panel. It will be understood that any number of power modules can be used, depending on the requirements of the particular application. System power, e.g., three-phase 480 AC main, is provided to control module 202 and power modules 204, 206, 208, 210 over power bus 214. Power supply system 201 provides signals to operate magnetron 100 from control module 202 on filament supply line 216 and electromagnetic supply line 218 and from power modules 204, 206, 208, 210 on high voltage supply line 220. In some exemplary embodiments, the current on filament supply line 216 is 0-5 Amperes, and its function is to heat the filament. Electromagnetic supply line 218 carries a current of DC 0-5 Amperes to generate magnetic field for magnetron control. High-voltage supply line 220 carries a current of DC 0-5 Amperes, at a voltage of 6,000-18,000 Volts, negative, to provide main magnetron current for microwave power. Power modules 204, 206, 208, 210 supply anodic current to magnetron 100 at a specified voltage, adjusted by means of electromagnet 106. Output power is controllable in the range of 3-100% of the nominal power as requested by the user. In controlling the output power, according to the present disclosure, it is understood that magnetron output power depends on magnetron anodic power. Based on look-up tables the system can set the anodic voltage by changing the electromagnetic current and can control the anodic current. In this way, the system can control the anodic electrical power fed to the magnetron and thus, indirectly, the magnetron output power. According to the present disclosure, the look-up tables are generated starting from eleven (11) values from 0% to 100% of the full scale for each of the parameters Ia (anodic current), If (filament current), Ic (electromagnet current), Va (anodic voltage).

Figure 7:
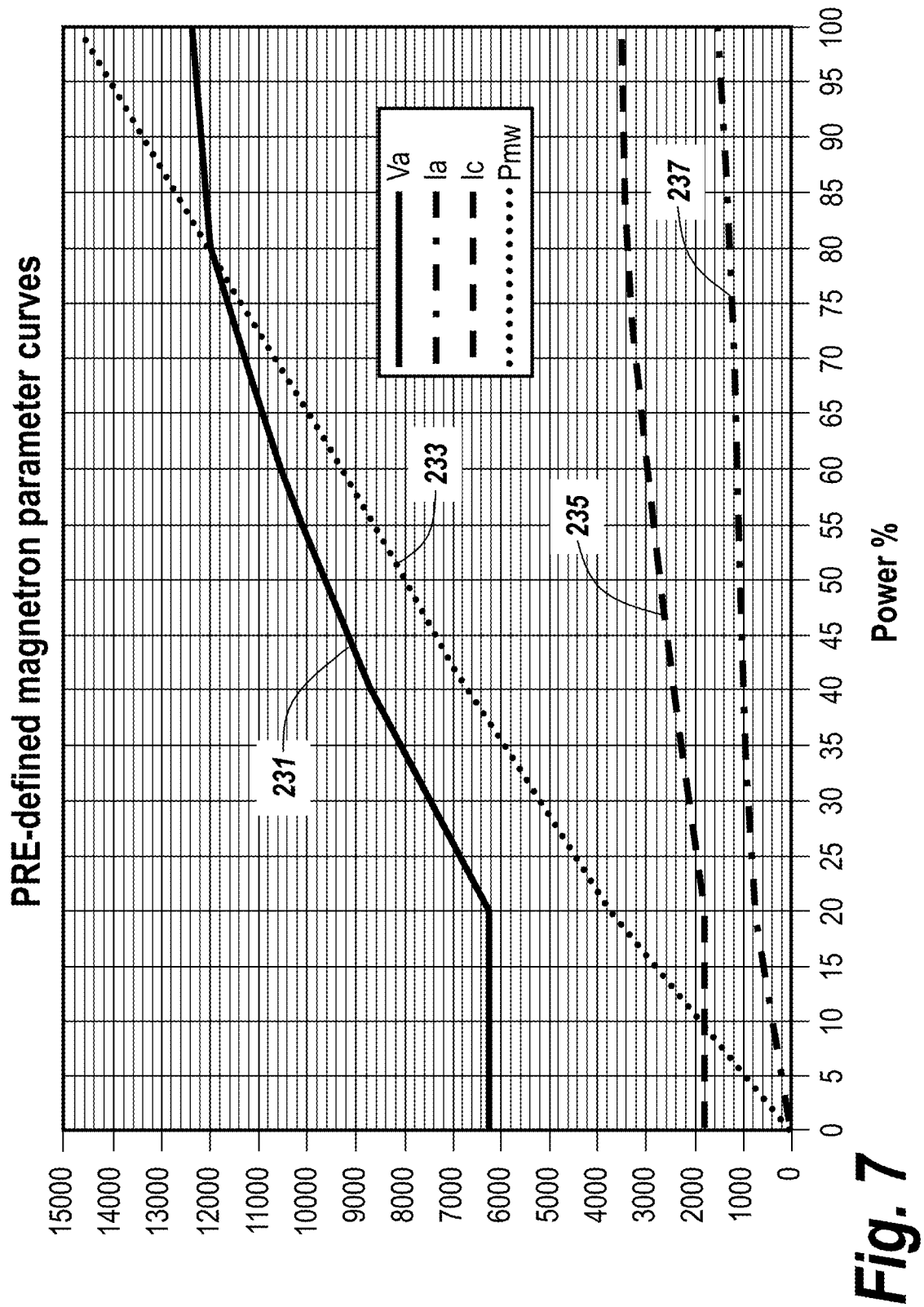
FIG. 7 is a graph including parameter curves for a magnetron according to some exemplary embodiments.
Figure 8A:
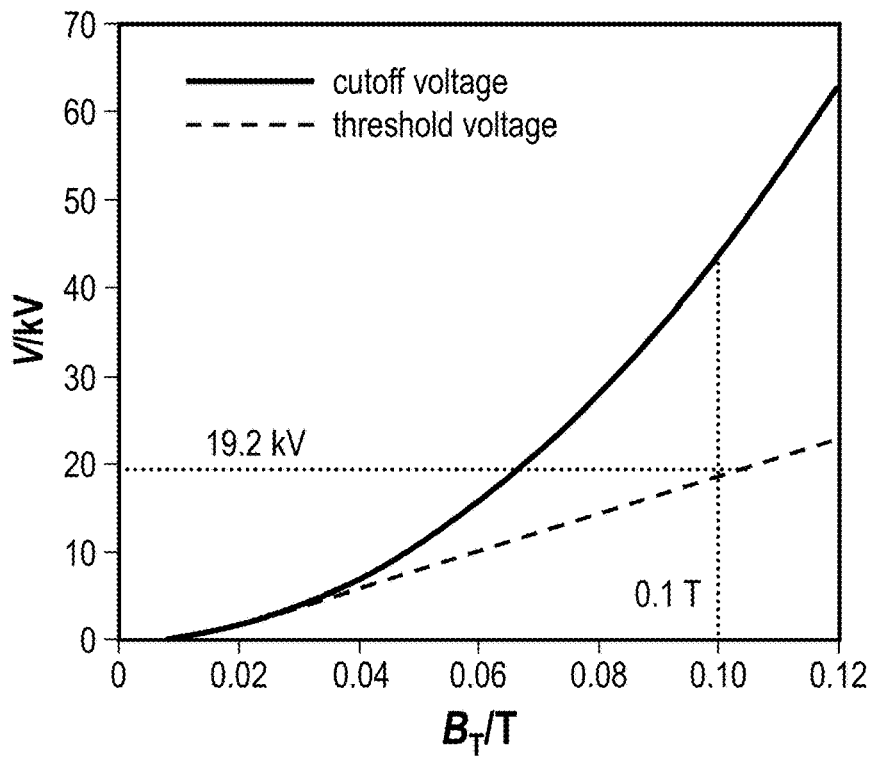
FIGS. 8A and 8B include graphs with curves illustrating the relationship between anode voltage and magnetic field of a magnetron according to some exemplary embodiments.
Figure 8B:
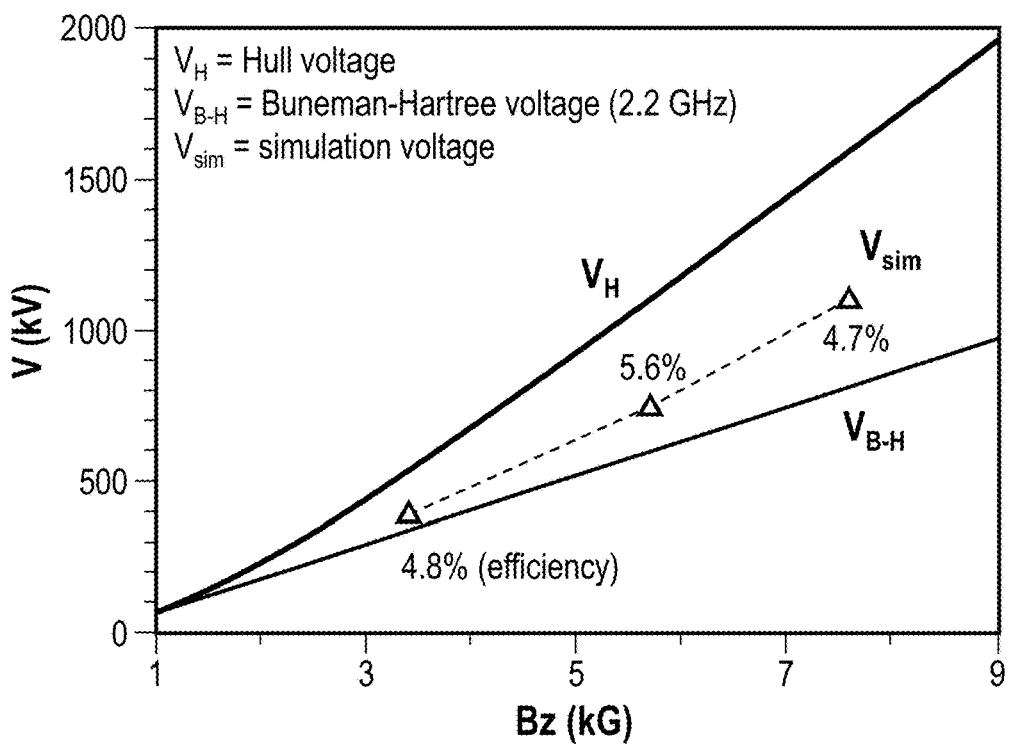

FIG. 7 is a graph including parameter curves for magnetron 100, according to some exemplary embodiments. Referring to FIG. 7, curve 231 represents anodic voltage Va (modulus, negative), curve 233 represents microwave power Pmw of the output in Watts, curve 235 represents electromagnetic current Ia in mAdc, and curve 237 represents anodic current Ia in mAdc. FIGS. 8A and 8B include graphs with curves illustrating the relationship between anode voltage and magnetic field of magnetron 100, according to some exemplary embodiments. The curves of FIGS. 8A and 8B show the values of Va, Ia, Ic, Pmw at different setpoint values. The curves of FIGS. 7, 8A and 8B show the life parameters of magnetron 100 at different output power levels and the relationship between magnetron magnetic field and magnetron anodic voltage. According to the present disclosure, output power is controlled while keeping the ratio of anode voltage to anode current, i.e., Va/Ia, constant.

According to the present disclosure, anodic voltage is controlled by means of accurate control of the electromagnet coil current. For every given output power setpoint, control module 202 determines the required anodic current level. It also determines the anodic voltage required to keep constant anodic impedance, in order to maintain constant Va/Ia ratio, and controls anodic voltage by changing the electromagnet coil current and so the magnetic field. Anodic voltage can be controlled by controlling the magnetic field, that is, the magnet coil current. Systems with dedicated magnet coil current control can set the proper level of anodic voltage and current at every power level.

Figure 9A:
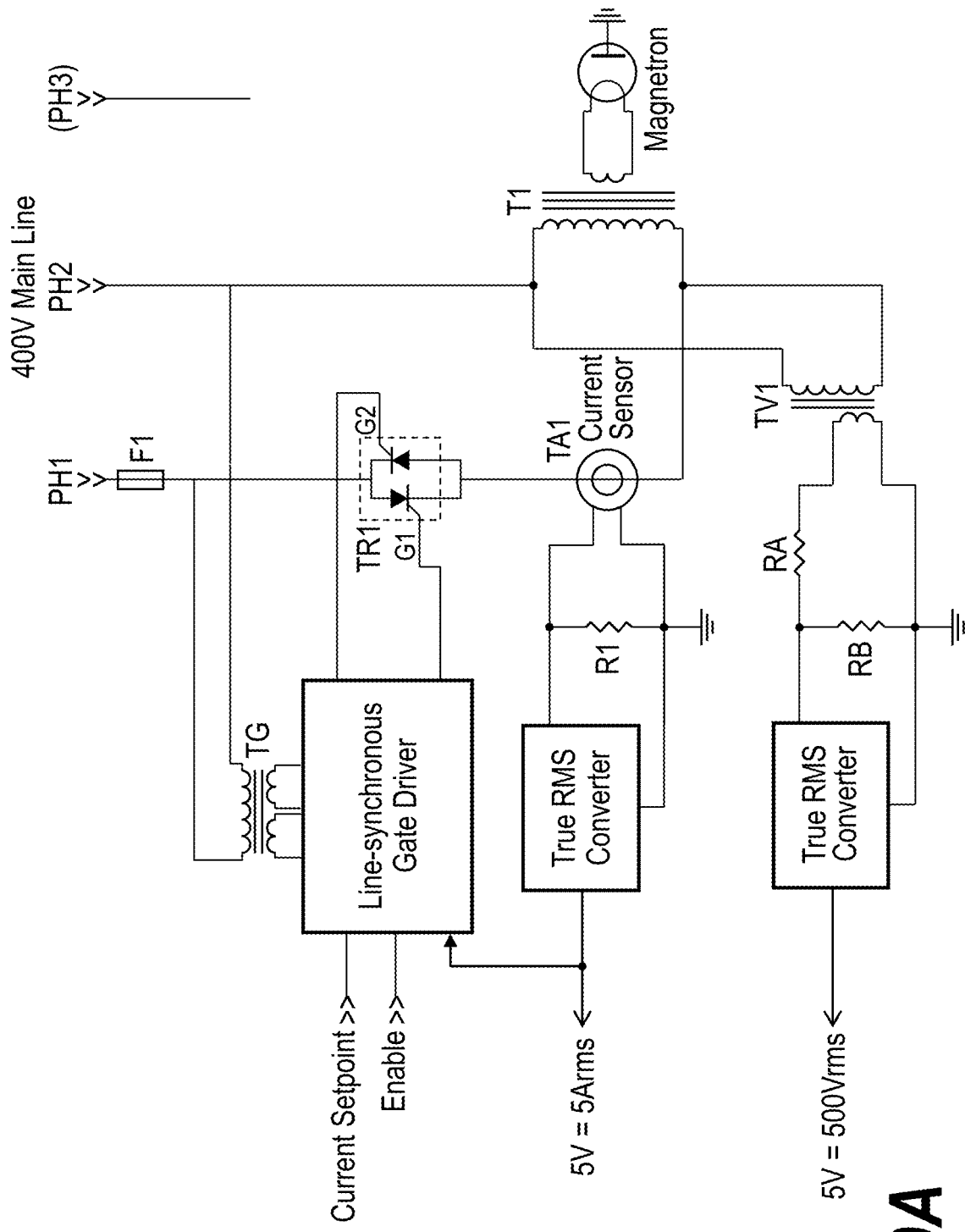
FIGS. 9A and 9C include schematic diagrams of control module 202, according to some exemplary embodiments.
Figure 9B:
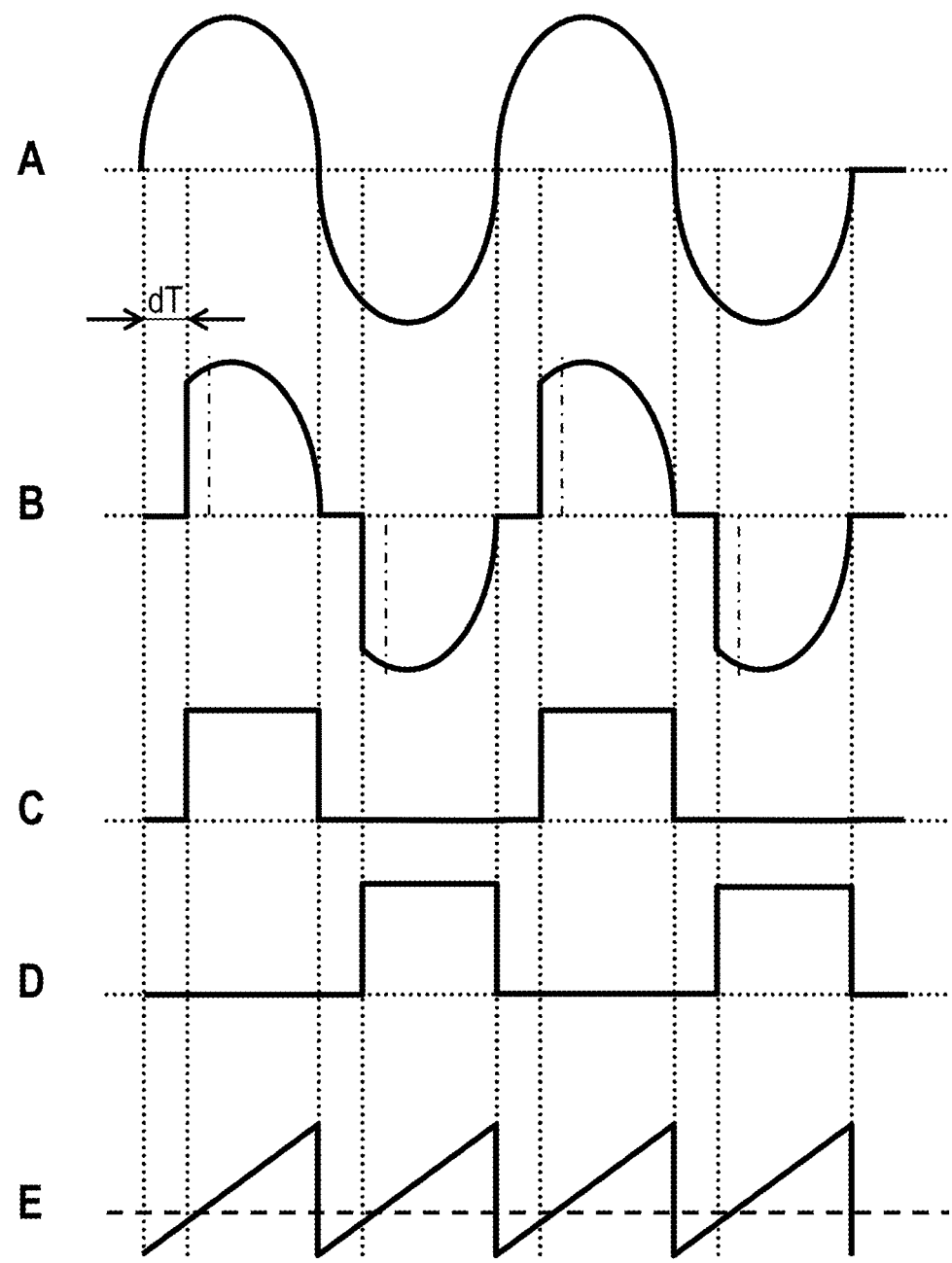
FIG. 9B includes schematic waveform diagrams of signals associated with operation of the circuits illustrated in FIGS. 9A and 9C, according to some exemplary embodiments.
Figure 9C:
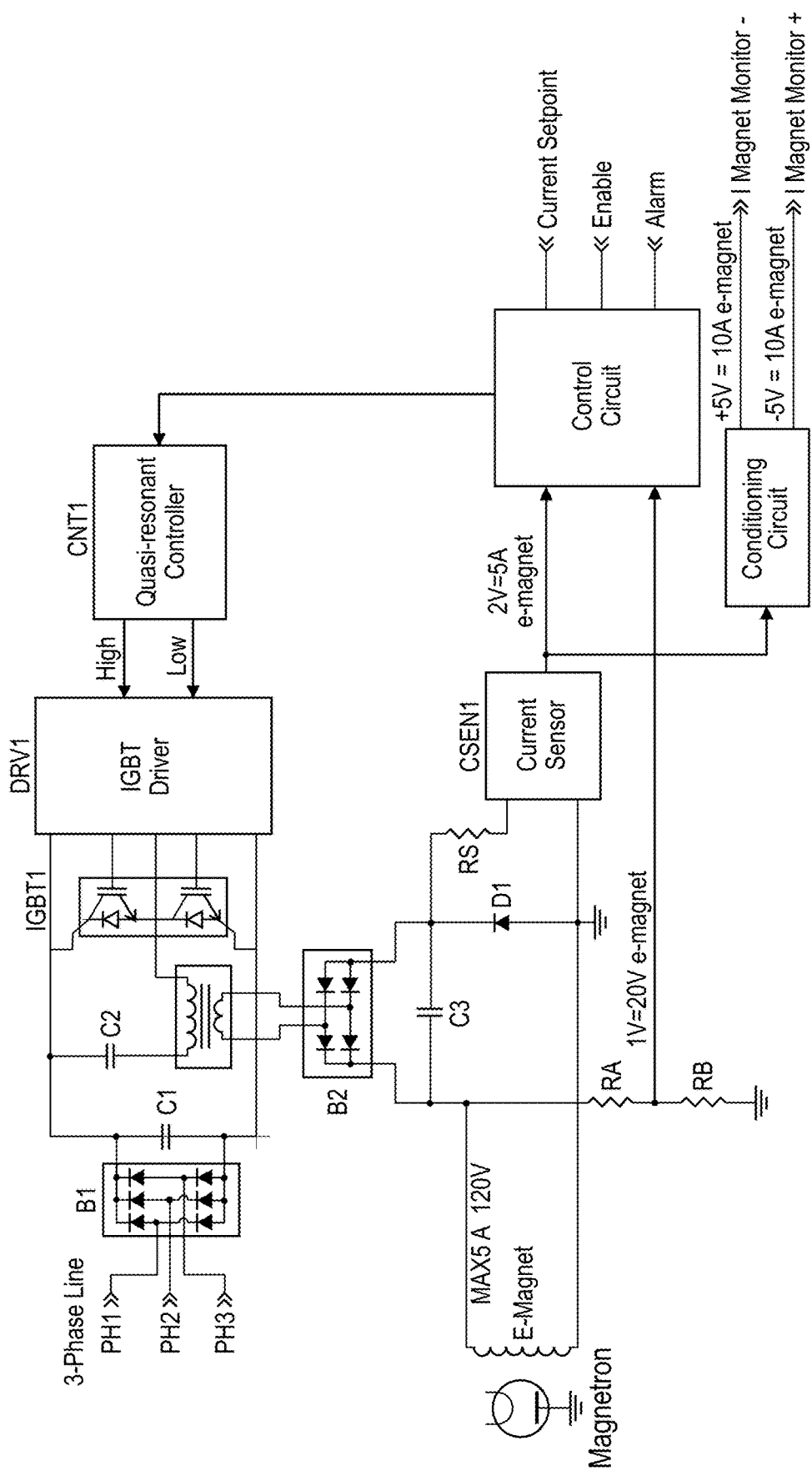

FIGS. 9A and 9C include schematic diagrams of control module 202, according to some exemplary embodiments. FIG. 9B includes schematic waveform diagrams of signals associated with operation of the circuits illustrated in FIGS. 9A and 9C, according to some exemplary embodiments. Referring to FIGS. 9A and 9B, only two of the three-phase lines are used in this portion of the circuitry. The current in the primary of the filament transformer T1 is phase-cut by a line synchronous gate driver, which powers the gates of a pair of thyristors TR1, wired in anti-parallel configuration. Referring to the waveforms of FIG. 9B, the line voltage is a sinus wave (A). The thyristors TR1 are triggered and switch on synchronously with the line, with a variable delay dT that is inversely proportional to the average current in the primary of the transformer T1, i.e., the longer the delay, the lower the average value of the current, that is therefore like (B).

The line-synchronous gate driver circuit generates two different drive signals, one for each thyristor gate, shown in (C) and (D), starting from the line synchronous voltages provided by transformer T3. The primary side current is sensed by a current transformer TA1, and a true RMS converter transforms it into a DC value. This value is compared to a saw tooth signal (E), generated by the line-synchronous gate driver, and the comparison forces the start of the gate driver pulses (C) and (D). This has a stabilizing action: if the RMS current value increases, the starting of the drive pulses is delayed, in a closed loop. The comparison level is also modified by the Current Setpoint signal, received from the CPU: the circuit lowers the level if the required current is greater and vice versa.

The ENABLE input forces the comparison level shown in (E) to the maximum value, thus zeroing the drive pulses, and consequently the current. The voltage on the primary side of the filament transformer T1 is sensed by a voltage transformer TV1, scaled by a resistive divider RA, RB and converted to a DC value by another true RMS converter. Both the current and voltage RMS values are routed back to the CPU for monitoring.

Referring to FIG. 9C, the 3-phase line is rectified by a full diode bridge B1, and then filtered by a capacitor C1. The DC bus is fed to a quasi-resonant power supply, in which a down-transformer T1in series with a resonant capacitor C2 is driven by an insulated-gate bipolar transistor (IGBT) power module IGBT1, which includes a pair of IGBTs. The IGBT1 module is driven by a dedicated double IGBT driver DRV1, piloted by a quasi-resonant zero-current switching (ZCS) integrated circuit controller CNT1. The controller sends alternatively a driving pulse to the upper IGBT through HIGH signal and to the lower IGBT through LOW.

When the lower IGBT is switched-on, capacitor C2 is charged through the primary of T1. The following pulse will drive the upper IGBT, thus discharging the capacitor C1 again through the primary winding of T1, but in this case the current will be reversed. The transformer is therefore driven by a series of current pulses, each of reverse polarity from the previous one. Each pulse is of the same time width, but they are temporally spaced to increase/decrease the average current in the transformer primary.

The secondary voltage of the transformer T1 is rectified by a diode bridge B2 and filtered by a capacitor C3. The positive of this voltage is directly connected to the electromagnet, while the negative is going to ground through a current sensing device CSEN1. CSEN1 provides a voltage, proportional to the current flowing, and feeds back this information to the controller CNT1, thus closing the control loop. The voltage across the electromagnet is also sensed by a resistive divider made by resistor RA and RB, and the information is provided to the control circuit. The control circuit is driven from the control CPU through an ENABLE input (to switch on and off the e-magnet current) and a current SETPOINT input, to set the amount of desired current (from 0 to 5 Ampere). It provides also an alarm output, in case the circuit is not able to provide the required current in the electromagnet. The value of electromagnet current is also converted to a differential monitor output, which is sent to the CPU for monitoring.

Referring to FIGS. 6A, 6B, 7, 8A, 8B, 9A, and 9B, control module 202 performs the control functions required to operate system 200 according to the present disclosure. For example, control module 202 drives the filament heating current If, the anodic current Ia and the electromagnetic current Ic, thus setting the working anodic voltage Va. Control module 202 also recognizes alarms and forces the user through a correct restart sequence. It also saves the system from magnetron "moding" events in which oscillations in the cavities other than at the resonant frequency occur. Control module 202 also manages allocation of power modules 202, 204, 206, 208. For example, if one of power modules 202, 204, 206, 208 fails, the CPU acts to replace the lost functionality with one or more of the other functioning power modules 202, 204, 206, 208. Control module 202 also provides the capability to set up the speed at which the system 200 changes power. Control module 202 also provides complete information regarding magnetron operation via the display and Fieldbus, which is a family of industrial computer network protocols used for real-time distributed control.

In some exemplary embodiments, power modules 202, 204, 206, 208 generate anodic current at medium/high anodic voltage. For example, in some exemplary embodiments, anodic voltage supply current is in the range 0-5 Amperes, DC, and anodic voltage is in the range of 6,000-18,000 Volts, negative. Magnetron anodic voltage is determined by the magnetron design and the intensity of the magnetic field. In magnetron 100 of the present disclosure, anodic current and electromagnet magnetic field intensity are controlled independently. Electromagnetic field is controlled by changing the magnetic drive current or electromagnet current, thus setting a desired working anodic voltage, within specified operational characteristics of magnetron 100. Thus, electrical (anodic) power fed to magnetron 100 can be configured at any combination of anodic current and voltage. For example, 35 kW of anodic power P can be achieved with voltage V of 15 kV @ current I of 2.33 A or voltage V of 12.5 kV @ current I of 2.8 A. In these cases, anodic impedance Z=V/I will be 6.44 kohm and 4.46 kohm, respectively.

According to the present disclosure, anodic voltage and anodic current are controlled simultaneously. As a result, magnetron 100 is capable of delivering any required power level, i.e., P=V×I, and the desired anodic impedance value Z=V/I, which, according to the present disclosure, is maintained constant.

The magnetron performance for a given load depends to a great extent on the equivalent impedance determined by the anodic voltage divided by the anodic current. According to the present disclosure, by implementing a systematized calculation, a constant equivalent impedance is achieved. This provides a highly improved magnetron performance and spectral output. The constant impedance schedule is achieved by controlling anodic voltage while anodic current increases. Anodic voltage is controlled by means of accurate control of the electromagnet coil current. For every given output power set point control module 202 determines the required anodic current level and the filament current. It also determines the anodic voltage required to keep constant anodic impedance and controls it by changing the electromagnet coil current and, therefore, the magnetic field.

Figure 10:
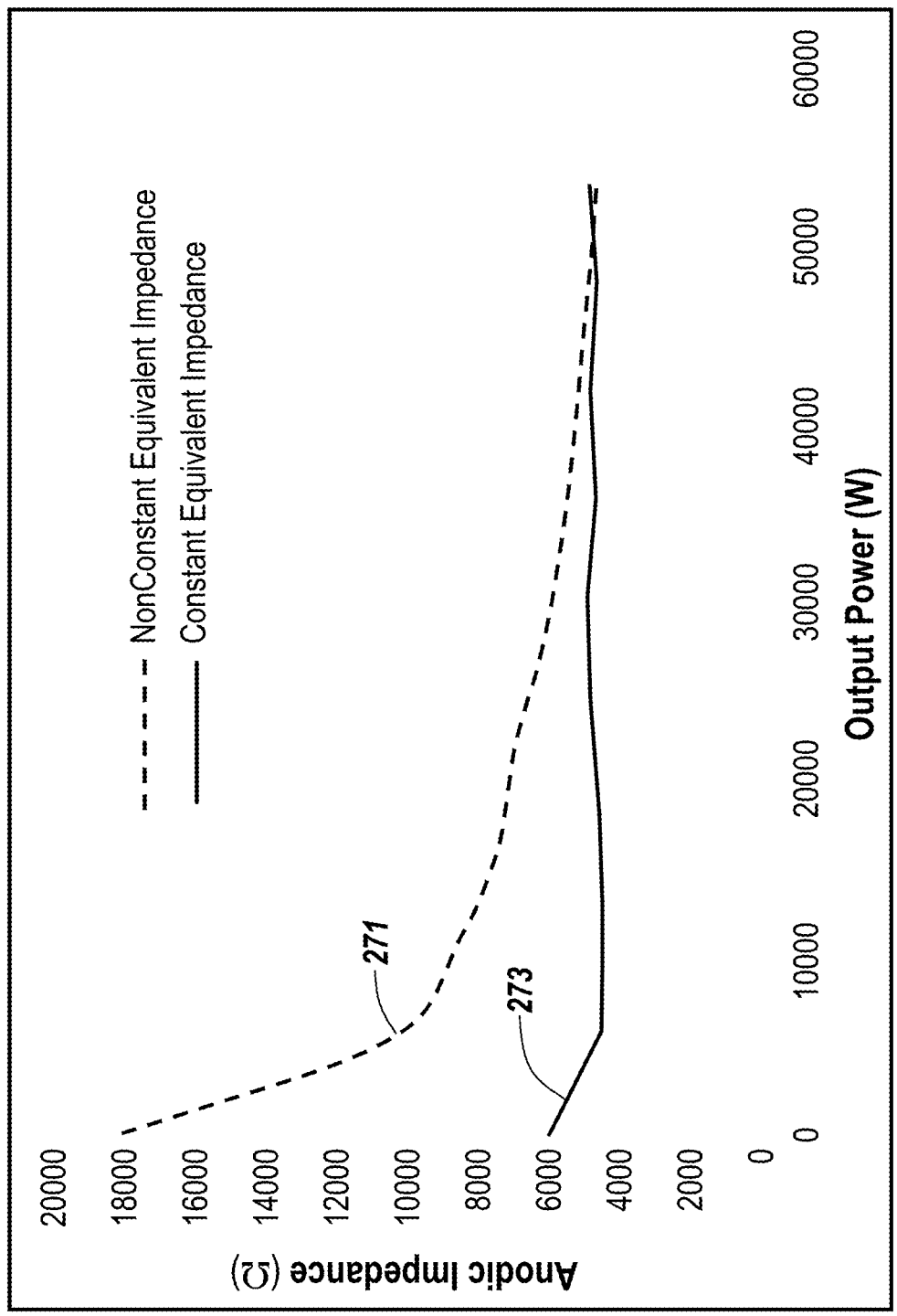
FIG. 10 is a graph illustrating anodic impedance versus magnetron output power for a conventional magnetron and a magnetron of the present disclosure.

FIG. 10 is a graph illustrating anodic impedance versus magnetron output power for a conventional magnetron and magnetron 100 of the present disclosure. Referring to FIG. 10, curve 271 if for the conventional magnetron and curve 273 is for magnetron 100 of the present disclosure. As shown in FIG. 10, essentially constant anodic impedance is implemented in accordance with the exemplary embodiments. This approach provides a highly improved magnetron performance and spectral output. For example, under the constant anodic impedance approach of the present disclosure, system reliability and availability are improved. Also, a cleaner and narrower microwave spectrum in the magnetron output is achieved. This results in improved process efficiency, especially in resonant cavities. According to the exemplary embodiments, the power control schedule will operate within the anodic current and voltage specifications of the magnetron system. This improved approach of the present disclosure is particularly effective in applications involving long, 24-hours-a-day, seven-days-a-week, continuous high-value processes in fields such as CVD synthetic diamond growth. According to the present disclosure, using the equivalent constant impedance, the broad banding of the magnetron spectral output is substantially reduced or eliminated. This provides a major improvement in operating magnetron 100 in a safe and reliable condition.

Figure 11:
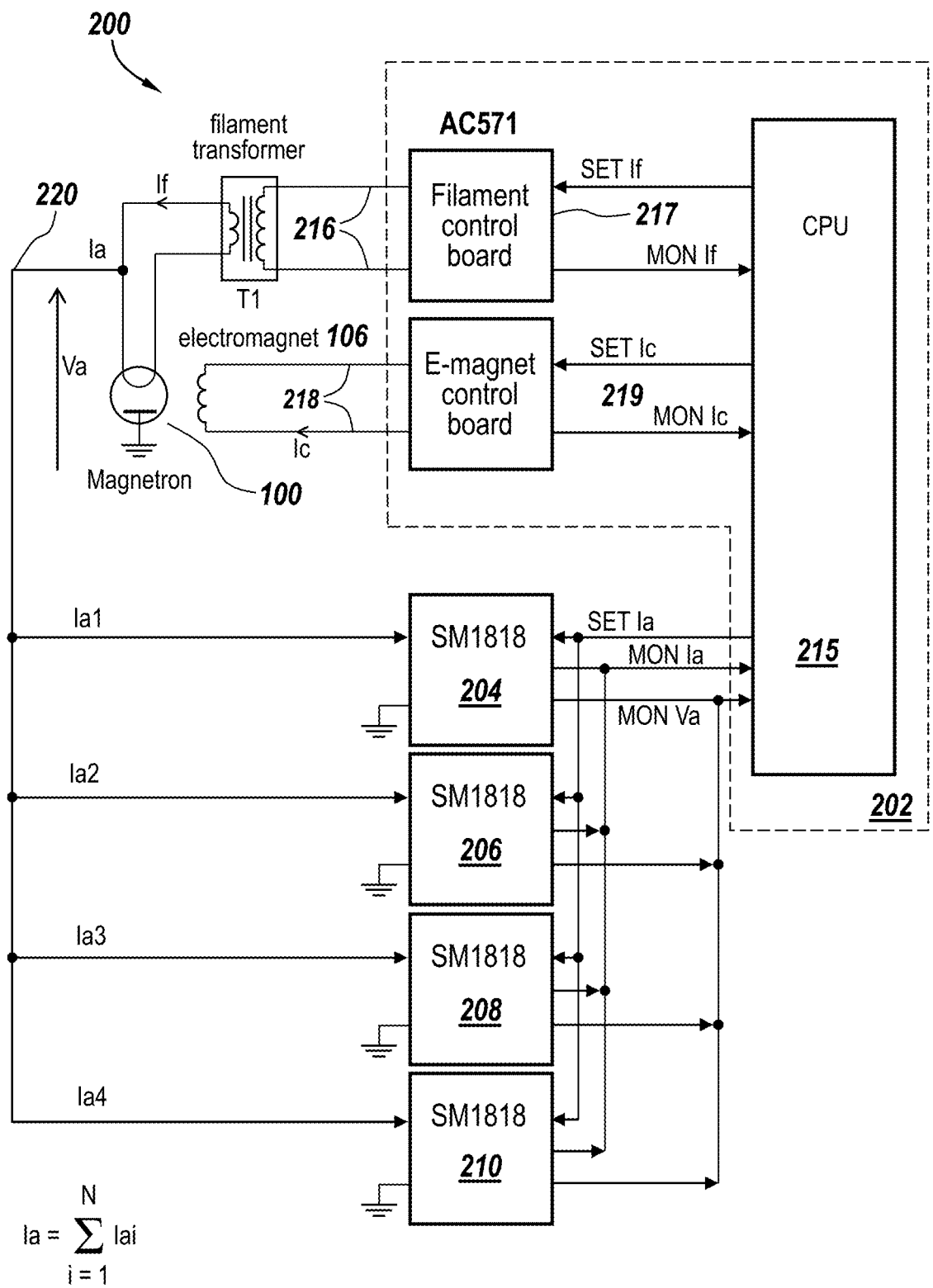
FIG. 11 is a schematic functional block diagram of the system illustrated in FIGS. 6A and 6B, illustrating additional functional details of the system, according to some exemplary embodiments.

FIG. 11 is a schematic functional block diagram of system 200 illustrated in FIGS. 6A and 6B, illustrating additional functional details of system 200, using magnetron 100, according to some exemplary embodiments. Referring to FIG. 11, control module 202 includes a central processing unit (CPU) 215, which performs the required processing, data/instruction storage, input/output, and other required tasks, to carry out the functionality of the exemplary embodiments. As illustrated, CPU 215 monitors and controls filament current If via filament control module or board 217 and monitors and controls electromagnet current Ic via electromagnet control module or board 219. Filament control board 217 drives filament transformer T1 to generate the desired filament current If. Electromagnet control board 219 drives electromagnet 106 to generate the desired electromagnet current Ic. CPU 215 also monitors and controls anodic current Ia and monitors anodic voltage Va. As described above, power modules 204, 206, 208, 210 generate the high voltage and drive overall anodic current Ia as a sum of the individual currents Ia1, Ia2, Ia3, Ia4, respectively.

Continuing to refer to FIG. 11, CPU 215 issues three setpoint signals: SET_Ia, the magnetron anodic current setpoint; SET If, the magnetron filament current setpoint; and SET_Ic, the magnetron electromagnet current setpoint. CPU 215 also monitors four monitor signals: MON_Ia, the magnetron anodic current monitor; MON_If the magnetron filament current monitor; MON_Ic, the magnetron electromagnet current monitor; and MON_Va, the magnetron anodic voltage monitor. All monitor signals are routed back to CPU 215 for monitoring and for alarming purposed. It is noted that, in the exemplary embodiments, anodic voltage Va is not a controlled value, since it is dependent on the other three controlled values, i.e., Ia, If, and Ic. Anodic voltage Va is monitored via MON_Va for check and alarming purposes. In some exemplary embodiments, the setpoint values are computed by interpolation from values stored in memory of CPU 215. The values are stored at 10% setpoint intervals, i.e., the eleven (11) values from 0% to 100% of the full scale for each of the parameters Ia, If, Ic, Va. The stored setpoint values are the recipe that can drive the magnetron at constant impedance, according to the exemplary embodiments. There are many different combinations of the three main setpoint values (Ia, If, Ic) that can produce the same microwave power, but not all the combinations are at constant impedance. According to the present disclosure, combinations that maintain constant impedance, i.e., constant Va/Ia, are selected. Table 1 below is an exemplary look-up table for a 75 kW full-scale magnetron, according to some exemplary embodiments. Table 1 includes the eleven exemplary setpoint values for parameters Va (Volts), Ia (mA), If (A), and Ic (mA) for the eleven microwave powers (Watts), for 0% to 100%.

TABLE 1

| %   | MW Power | Va    | Ia   | If  | Ic   |
|-----|----------|-------|------|-----|------|
| 0   | 0        | 6753  | 0    | 115 | 1838 |
| 10  | 7500     | 6753  | 1470 | 112 | 1838 |
| 20  | 15000    | 7943  | 2284 | 109 | 2166 |
| 30  | 22500    | 9132  | 2897 | 106 | 2493 |
| 40  | 30000    | 10322 | 3305 | 103 | 2821 |
| 50  | 37500    | 11512 | 3657 | 100 | 3149 |
| 60  | 45000    | 12701 | 3913 | 97  | 3476 |
| 70  | 52500    | 13891 | 4161 | 94  | 3804 |
| 80  | 60000    | 15081 | 4391 | 91  | 4132 |
| 90  | 67500    | 16270 | 4571 | 88  | 4459 |
| 100 | 75000    | 17460 | 4724 | 85  | 4787 |

Figure 12:
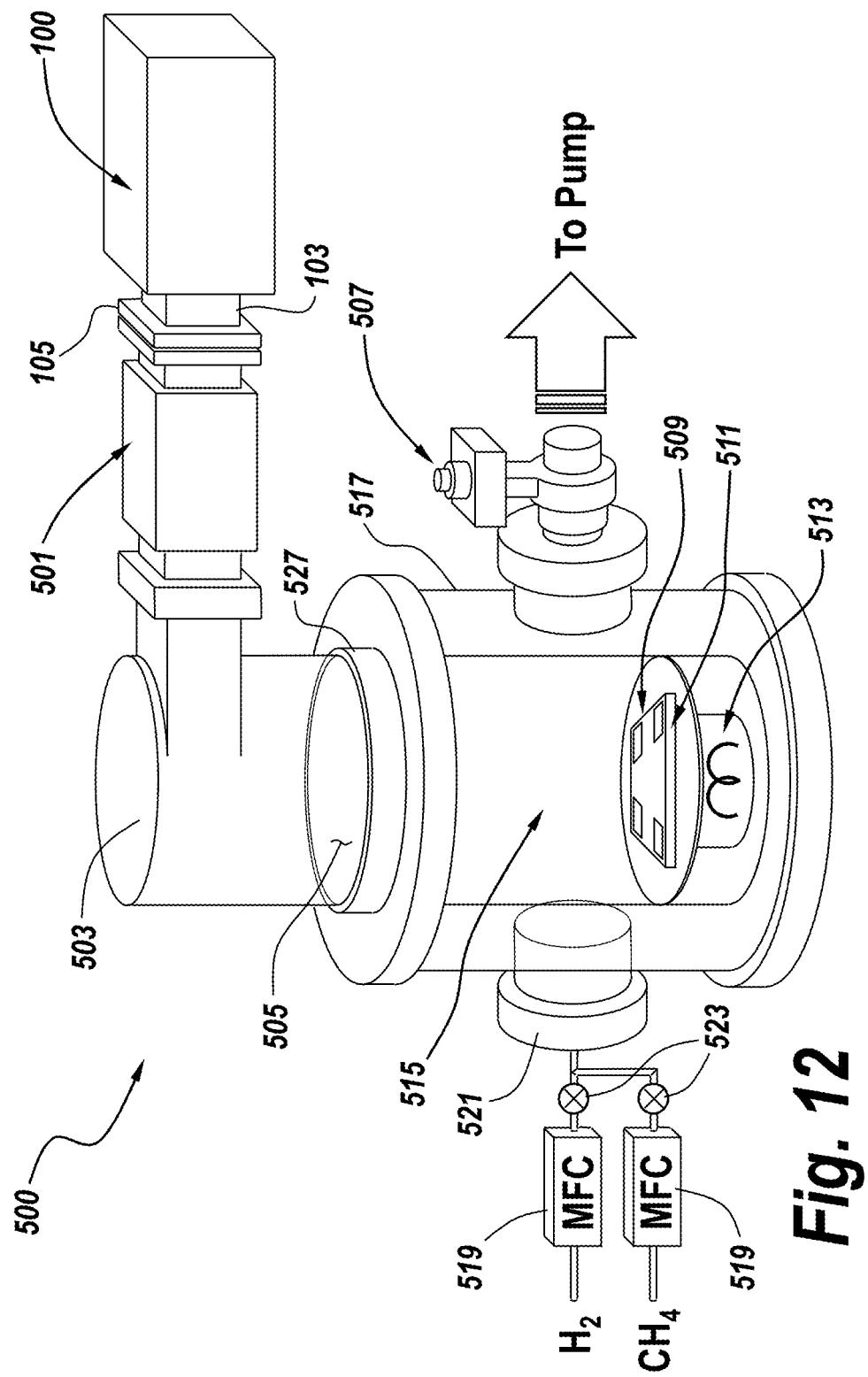
FIG. 12 includes a schematic diagram of a system 500, which uses magnetron 100 of the present disclosure, according to some exemplary embodiments.

FIG. 12 includes a schematic diagram of a system 500, which uses magnetron 100 of the present disclosure, according to some exemplary embodiments. System 500 can be, for example, a chemical vapor deposition (CVD) system, a CVD synthetic diamond growth system, or other such system. Referring to FIG. 12, system 500 includes a chamber 517 in which a substrate 509 to be processed can be mounted on a stage 511, which can be heated by a heater 513, such as a carbon heater. During processing, the pressure in chamber 517 can be reduced such as by a vacuum pump (not shown), which is connected to chamber 517 via pressure controller 507, which monitors and controls the pressure in chamber 517.

System 500 operates by igniting and sustaining plasma 515 within chamber 517, in the presence of substrate 509 being processed. Plasma 515 is ignited and sustained by excitation microwave energy generated by magnetron 100. The excitation microwave energy is coupled from magnetron 100 through its connected waveguide 103 and output flange 105, through an optional power monitor and/or stub tuner 501, through another waveguide 503, which is connected via microwave port 527 through microwave-transparent window 505 to the interior of chamber 517, where it excites plasma 515. Process gases for the plasma and/or for processing of substrate 509, can be introduced into the interior of chamber 517 from gas sources through process gas port 521. The gases, such as, for example, hydrogen (H2) and/or methane (CH4), can be routed from gas sources (not shown) through valves 523. Flow of the gases is controlled by mass flow controllers 519.

Long processes, such as CVD synthetic diamond growth, require microwaves at different power levels continuously for weeks. Therefore, in this environment, stability, reliability and availability are very important. In conventional high-power magnetron systems, output power is controlled by changing anodic current. This schedule is effective in controlling power, but it provides unnecessarily high voltage at lower power levels, broader spectrum and increased risks of arcing and discharge. In contrast, the schedule, i.e., the relationship between the life parameters of the magnetron and the different output power levels, of the present disclosure implements constant anodic impedance, i.e., voltage/current ratio, at different power levels, thus overcoming these drawbacks of conventional approaches, thus providing higher value to the owner/user. The cleaner, narrower spectrum provided by the approach of the present disclosure is also of high value in these applications where resonant cavities are used.

Whereas many alterations and modifications of the disclosure will become apparent to a person of ordinary skill in the art after having read the foregoing description, it is to be understood that the particular embodiments shown and described by way of illustration are in no way intended to be considered limiting. Further, the subject matter has been described with reference to particular embodiments, but variations within the spirit and scope of the disclosure will occur to those skilled in the art. It is noted that the foregoing examples have been provided merely for the purpose of explanation and are in no way to be construed as limiting of the present disclosure.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

The invention claimed is:

1. A microwave magnetron, comprising:
a cathode for emitting electrons;
a filament for receiving a filament current to heat the cathode to enable the cathode to emit the electrons;
an anode to which anodic power can be applied to affect a flow of the electrons;
an anodic power input for receiving the anodic power to be applied to the anode, the anodic power being characterized by an anodic current, an anodic voltage, and an anodic impedance, the anodic impedance being a quotient of the anodic voltage and the anodic current;
an electromagnet for providing a magnetic field in which the electrons flow;
an electromagnet power input for receiving electromagnet power and applying the electromagnet power to the electromagnet for controlling an intensity of the magnetic field, the electromagnet power being characterized by an electromagnet current; and
a controller for controlling parameters of the microwave magnetron, the controller adjusting at least one of the parameters of the magnetron to affect the flow of electrons while maintaining the anodic impedance constant.

2. The microwave magnetron of claim 1, wherein the parameters of the microwave magnetron controlled by the controller comprise the anodic current, the filament current, and the electromagnet current.

3. The microwave magnetron of claim 1, wherein the controller monitors the parameters of the microwave magnetron.

4. The microwave magnetron of claim 3, wherein the controller is adapted to issue an alarm based on at least one of the monitored parameters of the microwave magnetron.

5. The microwave magnetron of claim 1, wherein the controller monitors the anodic voltage.

6. The microwave magnetron of claim 3, wherein the controller is adapted to issue an alarm based on the monitored anodic voltage.

7. The microwave magnetron of claim 1, further comprising a filament control module between the controller and the filament, the filament control module generating a filament current monitoring signal and forwarding the filament current monitoring signal to the controller, and the filament control module receiving a filament current setting signal from the controller.

8. The microwave magnetron of claim 7, further comprising a filament transformer between the filament control module and the filament.

9. The microwave magnetron of claim 1, further comprising an electromagnet control module between the controller and the electromagnet, the electromagnet control module generating an electromagnet current monitoring signal and forwarding the electromagnet current monitoring signal to the controller, and the electromagnet control module receiving an electromagnet current setting signal from the controller.

10. The microwave magnetron of claim 1, further comprising a microwave output for providing output microwave energy out of the microwave magnetron.

11. The microwave magnetron of claim 10, wherein the microwave output is connectable to a system for processing a substrate.

12. The microwave magnetron of claim 11, wherein the system is a plasma generation system.

13. The microwave magnetron of claim 11, wherein the system is a chemical vapor deposition (CVD) system.

14. The microwave magnetron of claim 11, wherein the system is a synthetic diamond growth chemical vapor deposition (CVD) system.

* * * * *